(12) United States Patent
Devey

(10) Patent No.: US 6,768,650 B2
(45) Date of Patent: Jul. 27, 2004

(54) METHOD AND STRUCTURE FOR REDUCTION OF IMPEDANCE USING DECOUPLING CAPACITOR

(75) Inventor: William John Devey, Cannon Beach, OR (US)

(73) Assignee: International Business Machines Corporation, Armonk, NY (US)

( * ) Notice: Subject to any disclaimer, the term of this patent is extended or adjusted under 35 U.S.C. 154(b) by 87 days.

(21) Appl. No.: 10/072,684

(22) Filed: Feb. 7, 2002

(65) Prior Publication Data

US 2003/0147226 A1 Aug. 7, 2003

(51) Int. Cl.⁷ .......................... H05K 7/06; H01L 23/64
(52) U.S. Cl. .................... 361/782; 361/306.2; 361/780; 257/724
(58) Field of Search ............................ 361/306.2, 734, 361/738, 780, 782, 793, 794; 257/691, 700, 724, 777

(56) References Cited

U.S. PATENT DOCUMENTS

| | | | |
|---|---|---|---|
| 4,328,530 A | 5/1982 | Bajorek et al. | 361/762 |
| 4,349,862 A | 9/1982 | Bajorek et al. | 361/762 |
| 4,734,818 A * | 3/1988 | Hernandez et al. | 361/306.2 |
| 4,800,459 A | 1/1989 | Takagi et al. | 361/321.2 |
| 5,977,640 A | 11/1999 | Bertin et al. | 257/777 |
| 6,023,407 A | 2/2000 | Farooq et al. | 361/303 |
| 6,072,690 A | 6/2000 | Farooq et al. | 361/321.2 |
| 6,098,282 A | 8/2000 | Frankeny et al. | 29/852 |
| 6,200,400 B1 | 3/2001 | Farooq et al. | 156/89.16 |
| 6,216,324 B1 | 4/2001 | Farooq et al. | 29/25.42 |
| 6,262,877 B1 | 7/2001 | Mosley | 361/306.2 |
| 6,320,249 B1 * | 11/2001 | Yoon | 257/678 |
| 6,559,484 B1 * | 5/2003 | Li et al. | 257/207 |
| 2002/0071258 A1 * | 6/2002 | Mosley | 361/782 |
| 2002/0195700 A1 * | 12/2002 | Li | 257/700 |

* cited by examiner

*Primary Examiner*—John B. Vigushin
(74) *Attorney, Agent, or Firm*—Law Offices of Michael Dryja

(57) ABSTRACT

A decoupling capacitor structure and its use in a circuit board mounting an ASIC is provided. The decoupling capacitor structure is arranged so that parasitic inductance caused by the connection to the decoupling capacitor and the decoupling capacitor itself is reduced. The circuit boards include at least two voltage planes. An ASIC having active device(s) is connected to one face of the circuit board. A decoupling capacitor structure is provided having at least two conductive plates in a dielectric material and is connected directly or indirectly to the ASIC. Vias extend from the conductive plates through the dielectric material to connect to circuit board vias on a second face of the printed circuit board or to the ASIC. The decoupling capacitor vias are parallel to each other; and each via connected to one conductive plate is located adjacent a via connected to another conductive plate to minimize voltage deviation.

15 Claims, 8 Drawing Sheets

POSSIBLE MLC ELECTRODE PATTERN

METHOD AND STRUCTURE FOR REDUCTION OF IMPEDANCE USING DECOUPLING CAPACITOR

BACKGROUND OF THE INVENTION

1. Technical Field

This invention relates generally to decoupling of voltage planes in printed circuit structures mounting active device structures, such as ASICs and, more particularly, to decoupling voltage planes in printed circuit board structures in which ASICs are mounted, using a discrete capacitor device configured for respective voltage planes within ASIC chip assemblies.

2. Description of the Prior Art

A high current step load, such as may be created by device drivers typically generated within an ASIC (Application Specific Integrated Circuit), acts to create voltage deviations on the power bus due to source impedance of the power bus. As used herein, ASIC means any active device structure, including Bi-Polar, MOS, CMOS, and other similar active device structures, which may sometimes be referred as chip structures or integrated circuit (I/C) chip structures. Ideally, it would be desirable to hold these voltage deviations at zero. However, in the case of core logic and I/O drivers inside of large ASICs, a high di/dt (rate of change of current) load is common. Power distribution to the ASIC loads is by way of power planes within a circuit board to vias (usually several to several dozen), to solder balls, to pins, to ASIC planes, to loads. A typical structure is comprised of a multilayer board, typically in multilayer technology, such as FR-4, to which decoupling capacitors typically in MLC are placed around the ASIC on the board at locations on the circuit board as permitted by the wiring pattern on the surface and vias permitted by inner layer wiring. Normally, there are several dozen to several hundred decoupling capacitors (DCAPS) which are used. However, with this type of arrangement, significant decoupling capacitor parasitic inductance is added to plane distribution inductance to reduce decoupling effectiveness. It is desirable to reduce the parasitic inductances to as low a level as possible.

SUMMARY OF THE INVENTION

According to the present invention, a decoupling capacitor structure and its use in a circuit board mounting an ASIC is provided. The capacitor decoupling structure, and preferably the vias in the circuit board and the vias in the ASIC, are arranged in such a way that remote inductance caused by the connection to the decoupling capacitor and the decoupling capacitor itself is significantly reduced. The circuit board and structure are comprised of a printed circuit board having first and second opposite faces and including at least two voltage planes, at least one of which is typically a ground plane, and vias extending from each of the faces to one of the power planes. An ASIC structure is provided having active device(s) thereon and connectors connecting the active devices on the ASIC to the circuit board vias on one face of the printed circuit board. A decoupling capacitor structure is provided which has at least two interlaced conductive plates in a dielectric material forming at least one capacitor. Vias extend from each of the conductive plates through the dielectric material to connect to the circuit board vias on the second face of the printed circuit board or to the ASIC. The vias in the decoupling capacitor structure are configured and arranged such that the vias are parallel to each other and each via connected to one conductive plate is located adjacent a via connected to another conductive plate. This allows the current flowing in adjacent vias to flow in opposite directions and, thus, essentially cancel out any inductive effects generated by the current flowing.

It is also preferred that the vias in the circuit board be configured and arranged in the same manner such that they are parallel to each other and adjacent vias connected to the opposite conductive planes. Moreover, it is preferred, if possible, to design an ASIC chip with any vias therein which are connected to the internal power planes in the ASIC to be configured in the same way as the vias in the circuit board and the vias in the capacitor decoupling structure. It is also preferable that the vias in the ASIC, the vias in the circuit board, and the vias in the decoupling device that are connected to the same step load, be in a straight line through the assembly.

DESCRIPTION OF THE PREFERRED EMBODIMENTS

Technical Background

Figure 1:
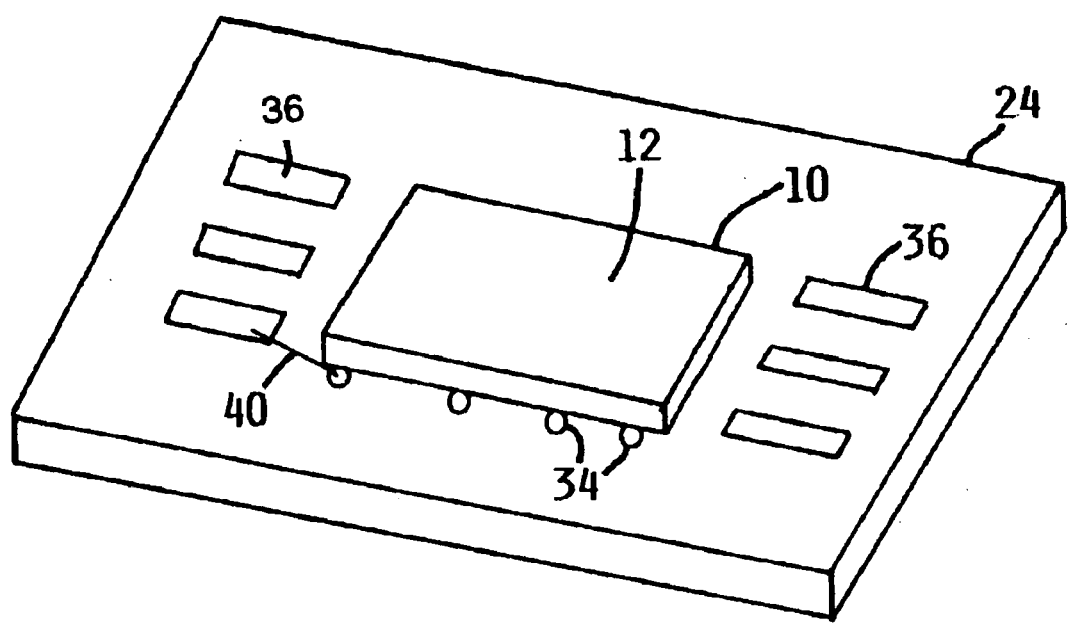
FIG. 1 is a perspective view of a typical prior art connection of an ASIC mounted on a circuit board connected to decoupling capacitors.
Figure 2:
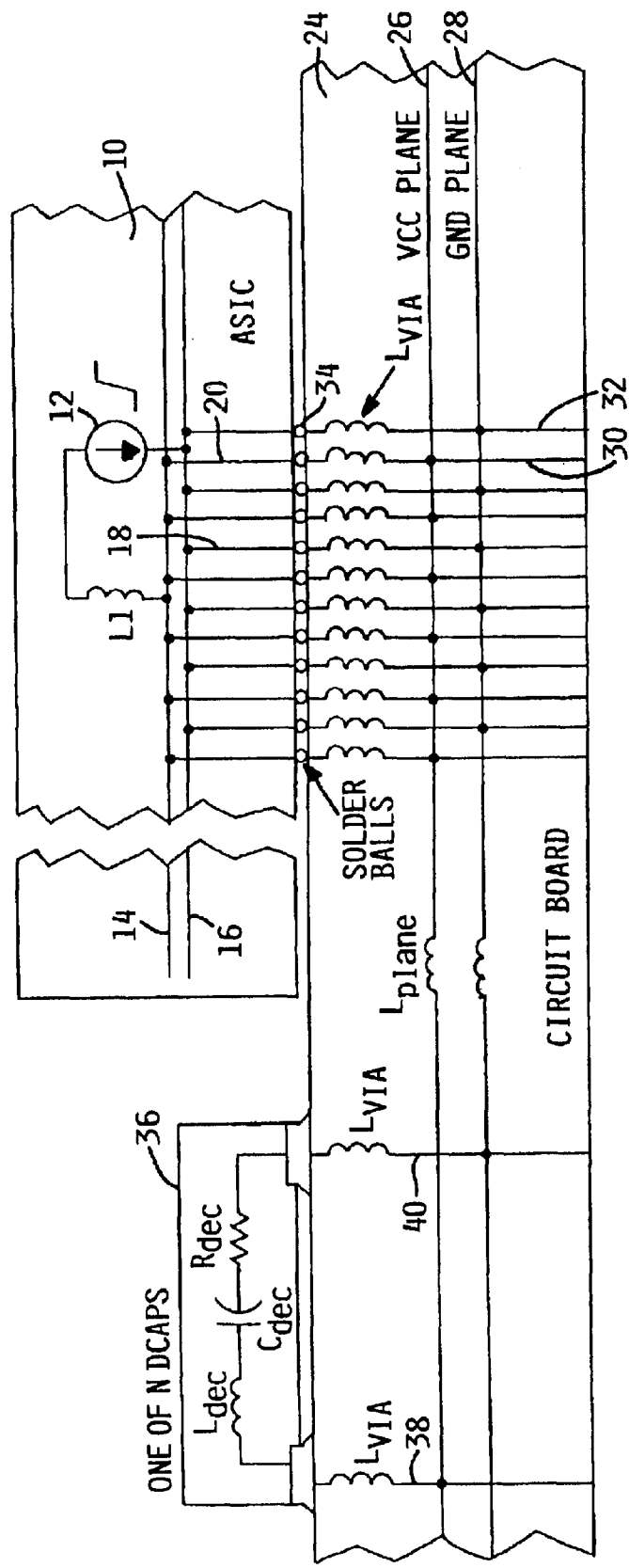
FIG. 2 is a longitudinal, sectional view, somewhat schematic, of the connection on an ASIC mounted on a circuit board to decoupling capacitors.
Figure 3:
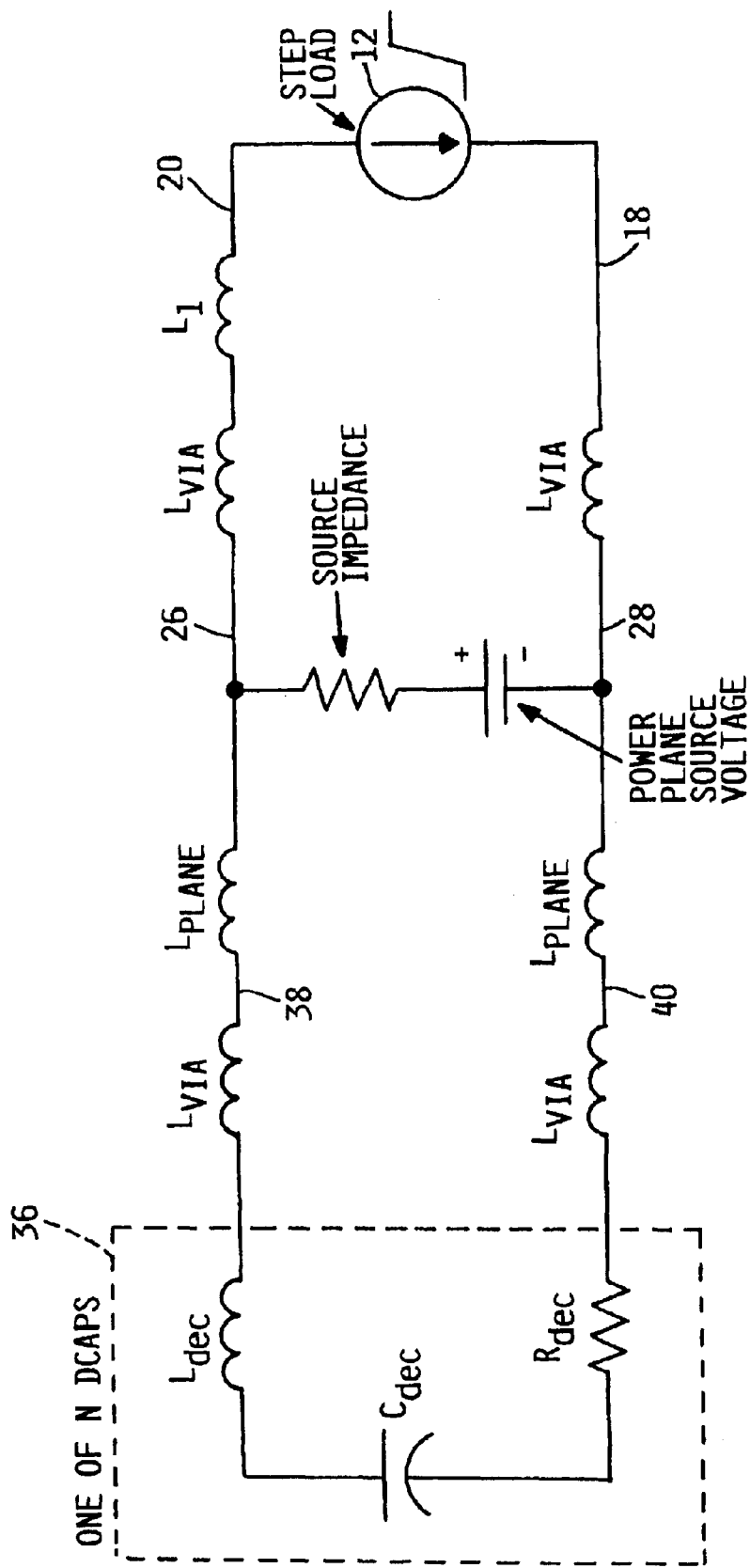
FIG. 3 is an equivalent circuit illustration of the various induced impedances of the prior art structure of FIGS. 1 and 2.

Turning now to the drawings, and for the present to FIGS. 1–3, the mounting structure and diagrammatic representation of the resulting self induced impedances of an ASIC mounted to a circuit board and connected to decoupling capacitors according to a typical prior art technique is shown. Referring specifically to FIGS. 1 and 2, an ASIC 10 is provided on which is shown an active device or step load 12 which typically could be a device driver. It is to be understood that there could be and normally would be many different active devices on the ASIC but only one is shown for illustrative purposes. The ASIC has a power plane 14 and a ground plane 16, although, as is well known in the art, these two planes could actually be two different levels of power planes. However, it is more usual to have a power plane and a ground plane. Thus, as used herein, power planes and ground planes and/or power planes at different levels will be referred to generically as voltage planes, and a voltage plane can refer to a plane on which either positive or negative voltage is impressed or a ground plane. Within the ASIC 10 are provided vias 18 and 20. The vias 18 connect to the power plane 14, and the vias 20 connect to the ground plane 16.

The ASIC 10 is mounted to a printed circuit or PC board 24 which has a power plane 26 and a ground plane 28. The PC board 24 also has vias 30 connected to the power plane 26 and vias 32 connected to the ground plane 28. The ASIC 10 is mounted to the PC board 24 by solder ball connections 34 in a well known manner which need not be described in detail.

Disposed on the same face of the PC board 24 on which the ASIC 10 is mounted are a plurality of capacitors 36 which are arranged around the periphery of the ASIC 10. Also, there can be a plurality of capacitors arranged on the opposite side of the PC board 24 around the footprint of the ASIC, with the same parasitic inductance effect. FIG. 2, and especially FIG. 3, shows the various inductances present which permit voltage deviation induced by the rapid di/dt changes inherent in high speed circuit structures of the type shown. The many parasitic elements which provide inductance and which can prevent ideal power distribution are shown in the equivalent circuit as illustrated in FIG. 3. The parasitic effects include the inductance of vias $L_{vias}$, inductance of the decoupling capacitors $L_{decs}$, resistance of the decoupling capacitors $R_{decs}$ and inductance of the voltage plane $L_{planes}$, all of which are in series with the decoupling capacitors $C_{dec}$ and which reduce the decoupling effectiveness of decoupling capacitors $C_{dec}$ 36.

First Embodiment

Figure 8:
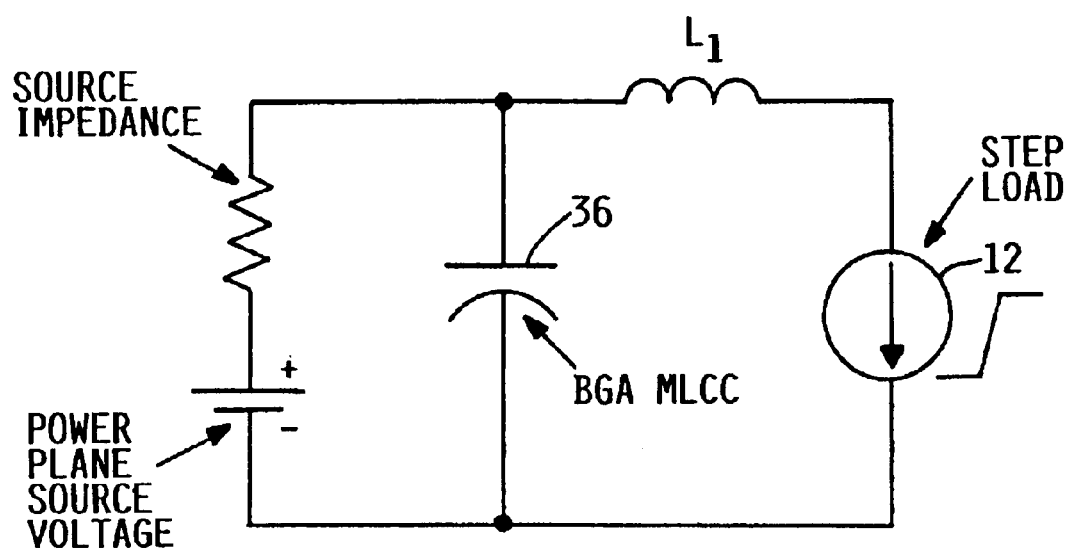
FIG. 8 is a schematic representation of an equivalent circuit with the impedances resulting from connection of the decoupling capacitor according to this invention.

Turning now to FIGS. 4–6 and 8, the ASIC 10 with a discrete capacitive decoupling device 46 mounted on the printed circuit board 24 according to one embodiment of the present invention is shown, together with the inductances, especially in FIG. 8 where the equivalent circuit of the present invention is shown.

Figure 4:
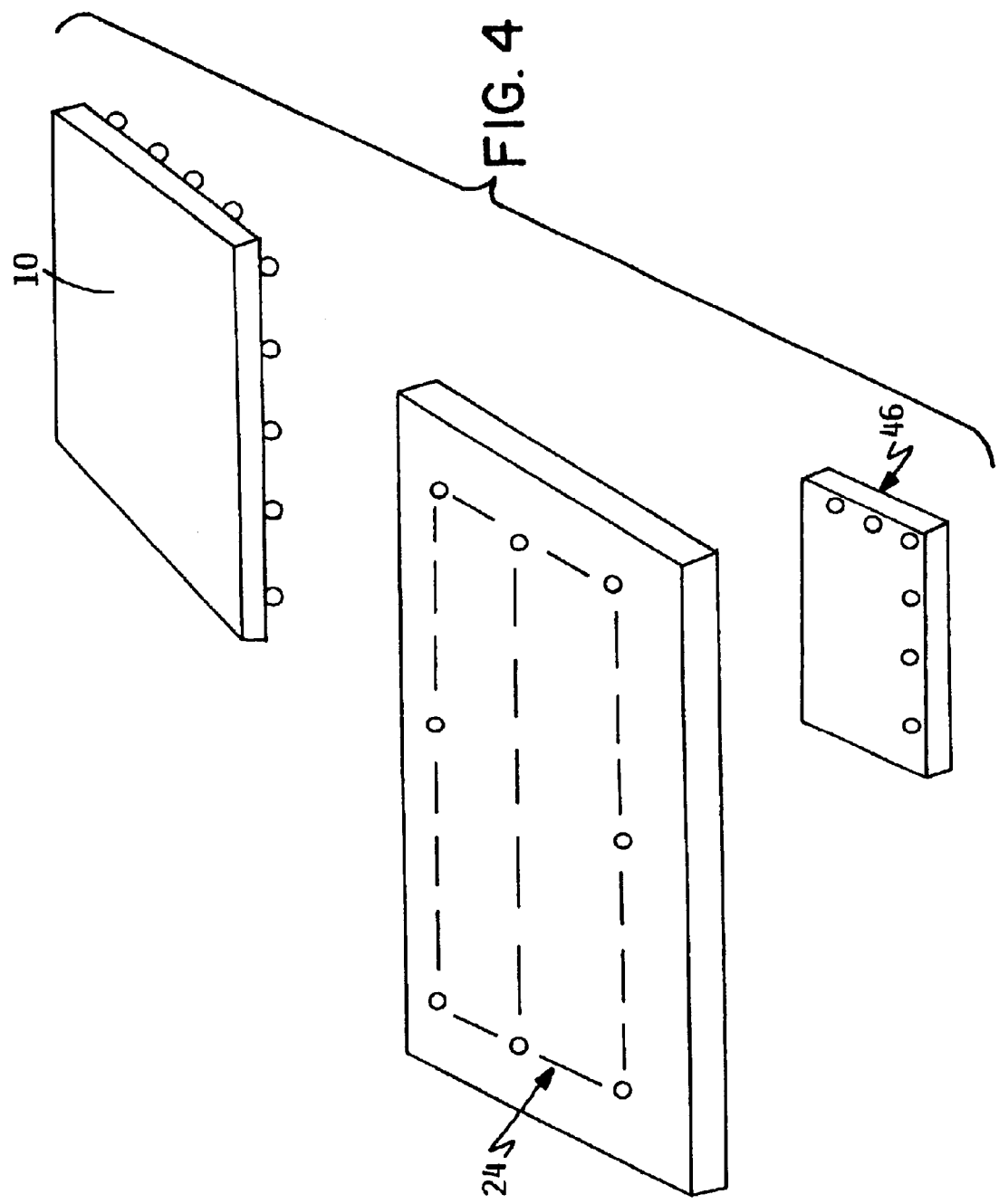
FIG. 4 is a perspective, exploded view of a circuit board mounting an ASIC and a decoupling capacitor according to one embodiment of this invention.
Figure 5:
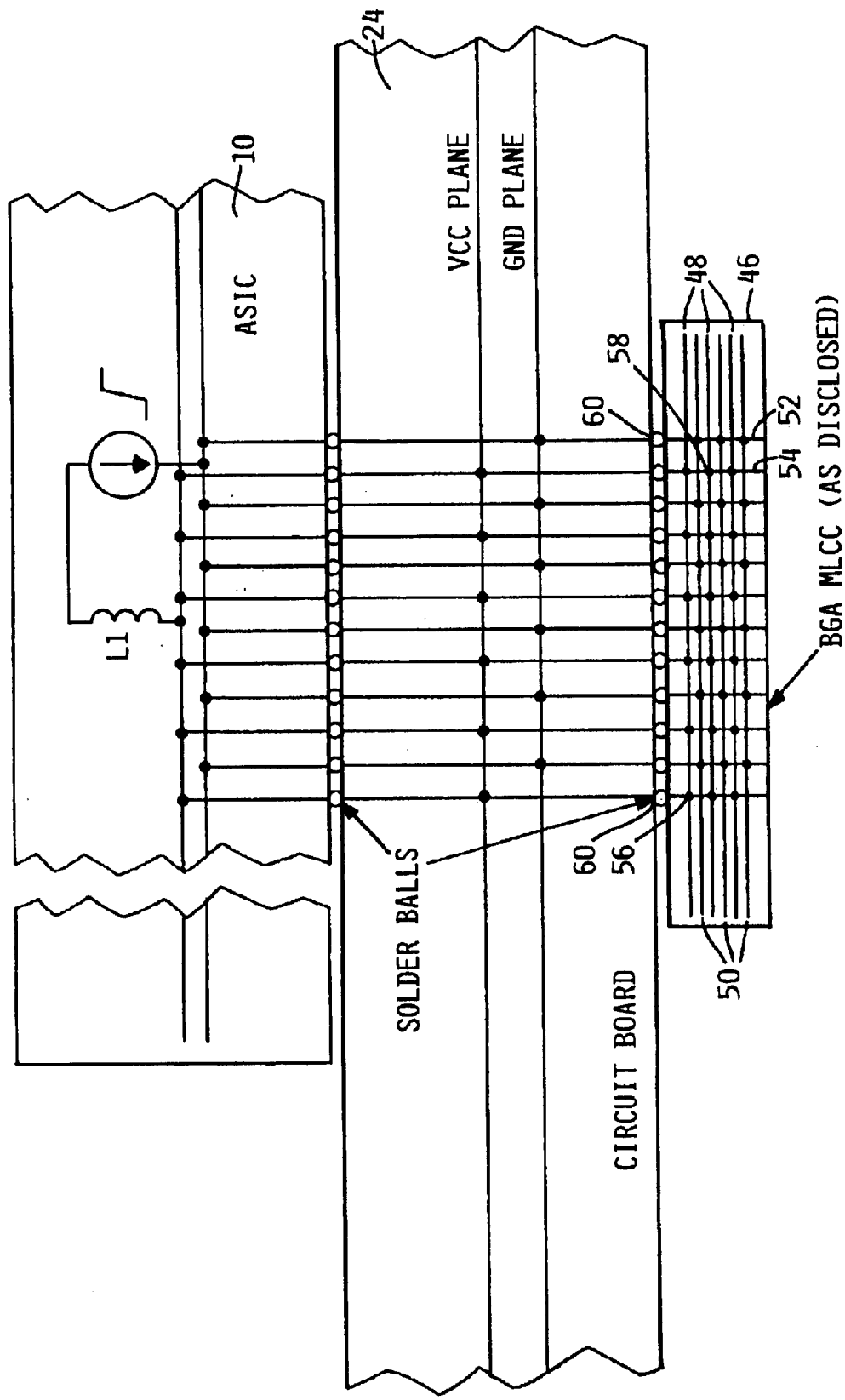
FIG. 5 is a longitudinal, sectional view, somewhat schematic, showing the mounting of a decoupling capacitor to a circuit board which mounts an ASIC according to one embodiment this invention.
Figure 6:
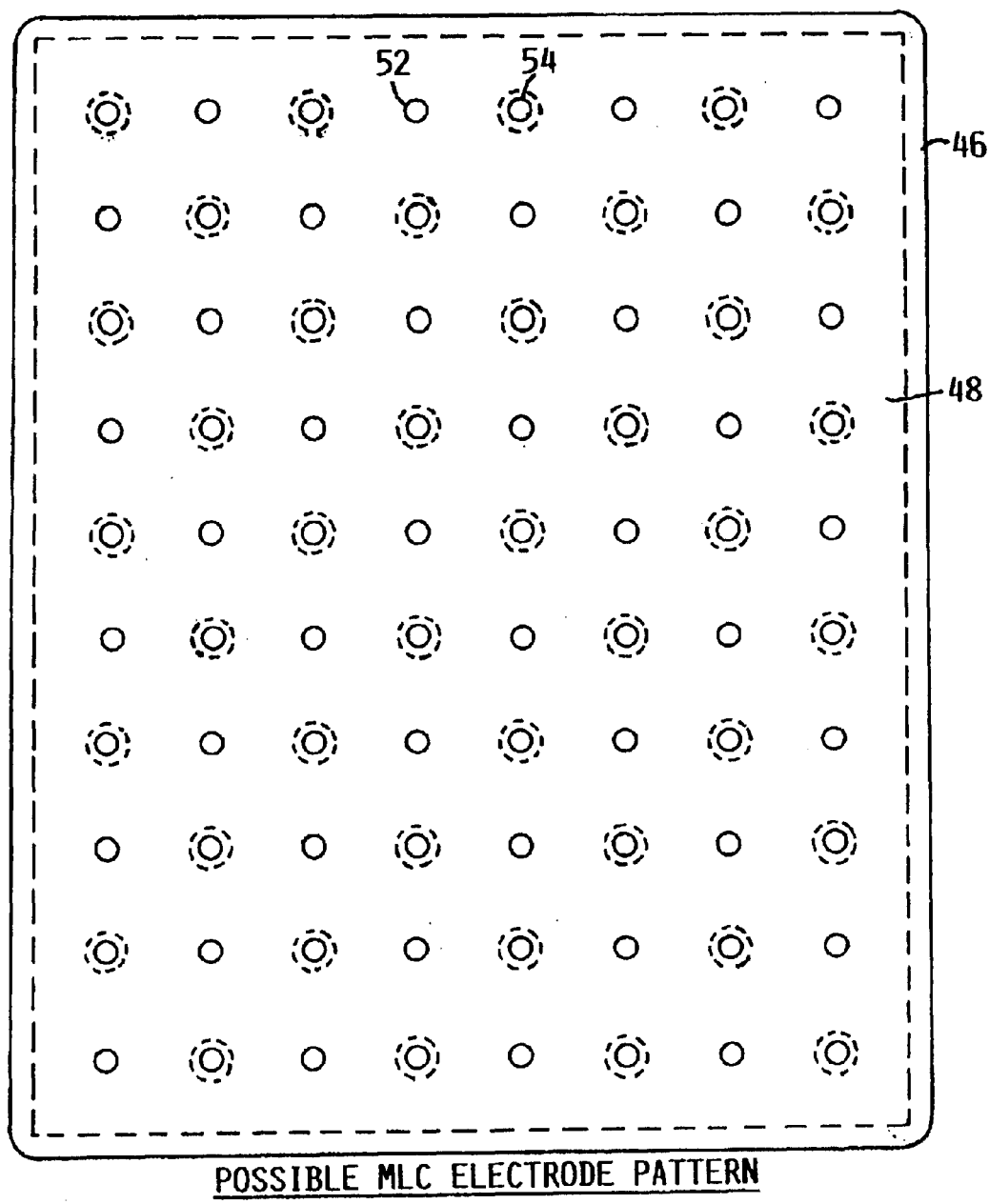
FIG. 6 is a plan view, somewhat schematic, of a decoupling capacitive device of this invention.

Referring now to FIGS. 4 and 5, the same ASIC 10 as previously described is mounted on a printed circuit board 24 similar to that as previously described. However, in this embodiment, a discrete capacitive decoupling device 46 is provided. (It should be noted that the invention is being described with respect to a single capacitive decoupling device used in conjunction with a single ASIC 10 mounted on a printed circuit board 24. However, it is to be understood that more than one ASIC 10 could be mounted on the circuit board and that a separate capacitive decoupling device 46 could be utilized in conjunction with each ASIC 10 which is mounted on the printed circuit board 24.) The decoupling capacitive device 46 has a pair of conductive plates 48 and 50 interleaved within a dielectric material 51 so as to define a capacitor. Vias 52 and 54 are provided in the dielectric material 51, the vias 52 connecting to conductive plate 48, and vias 54 connecting to the conductive plate 50. Openings 56 are provided in the conductive plate 48 to allow vias 54 to pass therethrough, and openings 58 are provided in the conductive plate 50 to allow vias 52 to pass therethrough. Each of the vias 52 and 54 is connected to one of the vias 30 or 32 in the printed circuit board 24, which vias are in turn connected to either the power plane 26 or the ground plane 28 in the printed circuit board 24, which power planes 26 and 28, respectively, are connected through solder balls 34 to the respective power and ground planes 14 and 16 in the ASIC 10, which power and ground planes in turn are connected to the active devices 12, one of which active devices is shown at 12. It should be noted that it is significant that the vias 52 and 54 preferably are parallel to each other, and each via 52 connected to a conductive plate 48 is adjacent a via 54 connected to a conductive plate 50 and, of course, conversely, each via 54 connected to conductive plate 50 is adjacent a via 52 connected to a conductive plate 48. A plan view of the capacitive device shows the vias 52 and 54 and it should be noted that all of the vias 52 and 54 are arranged such that each via 52 is surrounded by vias 54 and each via 54 is surrounded by via 52 in a "checker board" fashion.

There is a high di/dt load for the following reason. A positive step current load within the ASIC 10 will create a fast rate of change current flowing from the power plane 26 upwardly to the active device 12, and then back down to the conductive plate 50. This, if not compensated for, will cause high inductance. Thus, the arrangement of the vias 52 and 54 has the effect of tending to cancel out any self inductance effect.

It is also preferred that the decoupling capacitor device have the conductive plates 48 and 50 positioned essentially perpendicular to the vias 30 and 32 and parallel to power plane 26 and ground planes 28, which also will tend to cancel out any self inductance.

Moreover, to derive maximum benefit from the present invention it is desirable to have the vias 30 and 32 arranged essentially in the same pattern as the vias 52 and 54; i.e. that the vias 30 and 32 preferably are parallel to each other and such that a via 30 be adjacent a via 32, and a via 32 be adjacent a via 30. The same applies to the vias 18 and 20 in the ASIC 10 which also should be arranged in parallel fashion with via 18 next to a via 20 and a via 20 next to a via 18. Moreover, each via 18, via 30 and via 52 are arranged in essentially a straight line between the step load 12 and the plate 48, i.e. there is no, or at least minimal, transverse surface wiring on any surface so that the current flow is essentially unidirectional. The same is true with respect to via 20, via 32, and via 54. This also will reduce self inductance.

Second Embodiment

Figure 7:
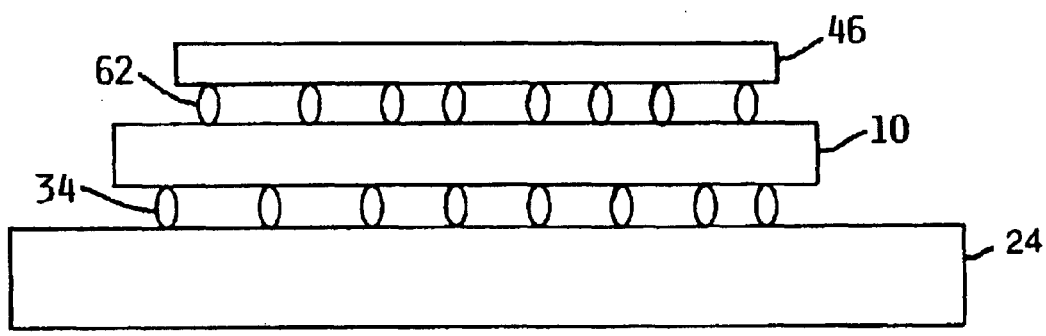
FIG. 7 is a side elevational view of the mounting of a decoupling capacitor according to another embodiment of this invention.

Another embodiment of the invention is shown in FIG. 7. In this embodiment, the decoupling capacitor device 46 is mounted directly on the ASIC 10 by solder balls 62, on the face of the ASIC 10 that is opposite the face connected to the PC board 24 by solder balls 34. This allows a direct connection to the planes 14 and 16 by vias 18 and 20 in the ASIC 10.

An equivalent circuit of the impedance and capacitance of the present invention is shown in FIG. 8. It can be seen that only induced inductance is $L_1$ which constitutes the sum of the unavoidable ASIC distributed parasitic conductances and trace amounts of parasitic inductances due to fringing effects of the vias is present. In any event, the resulting inductance $L_1$ is significantly lower than the total of the impedances in the prior art, as shown in FIG. 3.

Alternatives

It is to be understood that there are several modifications and variations that can be made to the present invention. For example, there are multiple conductive plates 48 and 50 that are arranged as but a single capacitance device, i.e. the voltage plane 26 is connected to all of the plates 48 and the ground plane 28 is connected to all of the plates 50, thus tying each of the connective plate together to form a single capacitive device.

Also, there could be more than two voltage planes within any given ASIC, each with its own capacitors, or a given voltage plane within any ASIC may have multiple capacitors.

While the invention has been described in combination with embodiments thereof, it is evident that many alternatives, modifications, and variations will be apparent to those skilled in the art in light of the foregoing teachings. Accordingly, the invention is intended to embrace all such alternatives, modifications and variations as fall within the spirit and scope of the appended claims.

I claim:

1. A discrete decoupling capacitor structure for reducing stray inductance in a circuit structure, which circuit structure includes:
a printed circuit board having first and second opposite faces and at least two voltage planes, and vias extending from each of said faces to one of said voltage planes, an TIC chip structure having at least one active device thereon, connectors connecting said active devices on said I/C chip structure to said vias on one face of said printed circuit board, said decoupling capacitor structure comprising:
at least two interlaced conductive plates in dielectric material forming at least one capacitor,
vias extending from each of said conductive plates through said dielectric material to connect each via to a circuit board via on said second face of said printed circuit board,
said vias in said decoupling capacitor structure being parallel to each other and each via connected to one conductive plate being located adjacent a via connected to another conductive plate,
wherein said vias in said printed circuit board are arranged in the same pattern as the vias in said decoupling capacitor, said I/C chip structure has vias therein arranged in the same pattern as the pattern of the vias in said decoupling capacitor, and each of said vias arranged in said pattern in said I/C chin structure being connected to active devices.

2. The invention as defined in claim 1 wherein said vias in said decoupling capacitor and the circuit board vias connected to said decoupling capacitor vias are each arranged in a straight line.

3. The invention as defined in claim 1 wherein said vias in said decoupling capacitor, and said vias in said I/C chip structure, and the circuit board vias connected to said decoupling capacitor vias, are each arranged in a straight line.

4. The invention as defined in claim 1 wherein each via in said decoupling capacitor connected to one circuit board via is completely surrounded by vias in said decoupling capacitor connected to another conductive plate.

5. The invention as defined in claim 1 wherein solder balls are provided to connect said decoupling capacitor to said circuit board.

6. A structure for reducing stray inductance in a circuit comprising:
a printed circuit board having first and second opposite faces and at least two voltage planes, and vias extending from each of said faces to one of said voltage planes,
an I/C chip structure having at least one active device thereon, connectors connecting said active devices on said I/C chip structure to said vias on one face of said printed circuit board, a discrete decoupling capacitor structure comprising at least two interlaced conductive plates in dielectric material forming at least one capacitor connected to the other face of said printed circuit board,
vias extending from each of said conductive plates through said dielectric material to connect each via to a circuit board via on said second face of said printed circuit board,
said vias in said decoupling capacitor structure being configured and arranged such that the vias are parallel to each other, and each vi connected to one conductive plate is located adjacent a via connected to another conductive plate,
wherein said vias in said printed circuit board are arranged in the same pattern as the vias in said decoupling capacitor, said I/C chip structure has vias therein arranged in the same pattern as the pattern of the vias in said decoupling capacitor, and each of said vias arranged in said pattern in said I/C chip structure being connected to active devices.

7. The invention as defined in claim 6 wherein said vias in said decoupling capacitor and the circuit board vias connected to said decoupling capacitor vias are each arranged in a straight line.

8. The invention as defined in claim 6 wherein said vias in said decoupling capacitor and the circuit board vias connected to said decoupling capacitor vias and the vias in said I/C chip structure are each arranged in a straight line.

9. The invention as defined in claim 6 wherein each via in said decoupling capacitor connected to one circuit board via is completely surrounded by vias in said decoupling capacitor connected to another conductive plate.

10. The invention as defined in claim 6 wherein solder balls are provided connecting said decoupling capacitor to said circuit board.

11. A method for reducing stray inductance in a circuit comprising the steps of:
providing a printed circuit board having first and second opposite faces and at least two voltage planes, and vias extending from each of said faces to one of said voltage planes,
providing an I/C chip structure having at least one active device thereon; connectors connecting said active devices on said I/C chip structure to said conductors on one face of said printed circuit board,
providing a discrete decoupling capacitor structure comprising at least two interlaced conductive plates in dielectric material fanning at least one capacitor, vias extending from each of said conductive plates through said dielectric material, said vias in said decoupling capacitor structure being configured and arranged such that the vias are parallel to each other, and each via connected to one conductive plate is located adjacent a via connected to another conductive plate, and
connecting each circuit board via to a decoupling capacitor on said second face of said printed circuit board,
wherein said vias in said printed circuit board are arranged in the same pattern as the vias in said decoupling capacitor, said I/C chip structure has vias therein arranged in the same pattern as the pattern of the vias in said decoupling capacitor, and each of said vias arranged in said pattern in said I/C chip structure being connected to active devices.

12. The invention as defined in claim 11 wherein said vias in said decoupling capacitor and the circuit board vias connected to said decoupling capacitor vias are each arranged in a straight line.

13. The invention as defined in claim 11 wherein said vias in said decoupling capacitor and the circuit board vias connected to said decoupling capacitor vias and the vias in said I/C chip structure are each arranged in a straight line.

14. The invention as defined in claim 11 wherein each via in said decoupling capacitor connected to one circuit board via is completely surrounded by vms in said decoupling capacitor connected to another conductive plate.

15. The invention as defined in claim 11 wherein solder balls are provided connecting said decoupling capacitor to said circuit board.

* * * * *